US007056826B2

(12) United States Patent
Wu et al.

(10) Patent No.: US 7,056,826 B2
(45) Date of Patent: Jun. 6, 2006

(54) METHOD OF FORMING COPPER INTERCONNECTS

(75) Inventors: Zhen-Cheng Wu, Hsin-Chu (TW); Yung-Cheng Lu, Taipei (TW); Ying-Tsung Chen, Chiayi (TW); Syun-Ming Jang, Hsin-Chu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 0 days.

(21) Appl. No.: 10/337,684

(22) Filed: Jan. 7, 2003

(65) Prior Publication Data
US 2004/0130035 A1 Jul. 8, 2004

(51) Int. Cl.
*H01L 21/4763* (2006.01)
(52) U.S. Cl. .................... 438/627; 438/634; 438/636; 438/637; 438/687
(58) Field of Classification Search ............. 438/633, 438/634, 636–638, 627, 672, 687
See application file for complete search history.

(56) References Cited

U.S. PATENT DOCUMENTS

| 5,003,062 | A | | 3/1991 | Yen |
| 5,821,168 | A * | 10/1998 | Jain ......................... 438/692 |
| 6,136,682 | A * | 10/2000 | Hegde et al. ............... 438/622 |
| 6,165,894 | A | | 12/2000 | Pramanick et al. |
| 6,174,810 | B1 | | 1/2001 | Islam et al. |
| 6,294,457 | B1 * | 9/2001 | Liu .......................... 438/623 |
| 6,309,955 | B1 * | 10/2001 | Subramanian et al. ...... 438/618 |
| 6,323,121 | B1 * | 11/2001 | Liu et al. .................. 438/633 |
| 6,352,917 | B1 * | 3/2002 | Gupta et al. ............... 438/622 |
| 6,410,426 | B1 | | 6/2002 | Xing et al. |
| 6,417,092 | B1 | | 7/2002 | Jain et al. |
| 6,444,568 | B1 * | 9/2002 | Sundararajan et al. ...... 438/627 |
| 6,486,283 | B1 | | 11/2002 | Hong et al. |
| 6,489,423 | B1 | | 12/2002 | Jung et al. |
| 6,489,432 | B1 | | 12/2002 | Jung et al. |
| 6,492,441 | B1 | | 12/2002 | Hong et al. |
| 6,548,613 | B1 * | 4/2003 | Jung et al. ................ 526/329.6 |
| 6,576,345 | B1 * | 6/2003 | Van Cleemput et al. .... 428/447 |
| 6,806,111 | B1 * | 10/2004 | Ehrichs et al. ............. 438/29 |
| 2001/0025205 | A1* | 9/2001 | Chern et al. ............... 700/121 |
| 2002/0060363 | A1* | 5/2002 | Xi et al. .................... 257/751 |
| 2002/0155386 | A1* | 10/2002 | Xu et al. ................... 430/312 |

OTHER PUBLICATIONS

Havemann, Robert H. and Hutchby, James A., "High-Performance Interconnects: An Integration Overview," Proceedings of the IEEE, vol. 89, No. 5, May 2001, pp. 586-601.
The Semiconductors Network, "Copper, with and without Damascene," http://www.semiconductors.net/technical/damascene_copper.htm (visited Sep. 25, 2002).

* cited by examiner

*Primary Examiner*—Hsien-Ming Lee
(74) *Attorney, Agent, or Firm*—Duane Morris LLP

(57) ABSTRACT

A method of forming copper interconnects for an integrated circuit is provided. An antireflective coating layer is formed over an insulating layer formed over a semiconductor substrate. An interconnect pattern is patterned and etched into said insulating layer. A diffusion barrier layer is then conformally deposited in a deposition chamber along the etched interconnect pattern, wherein the antireflective coating is removed in said chamber before deposition of the barrier layer. Copper interconnects are then formed in the interconnect pattern etched in the insulating layer.

23 Claims, 3 Drawing Sheets

US 7,056,826 B2

METHOD OF FORMING COPPER INTERCONNECTS

FIELD OF THE INVENTION

The present invention relates to semiconductor fabrication techniques and structures, and more particularly to copper interconnects and methods of forming the same.

BACKGROUND OF THE INVENTION

Integrated circuits formed on semiconductor substrates typically include several metal layers that electrically interconnect the devices formed therein. The different metal layers are separated by insulating layers known as interlevel (or interlayer) dielectric layers (ILD) that have etched via holes (also known as vias) therein to connect devices or active regions from one layer of metal to the next.

Copper (Cu) interconnects are increasingly used for high density devices because of copper's improved conductivity relative to conventional materials such as aluminum (Al). The use of copper as the interconnect material presents various fabrication problems. First, there is currently no production-worthy etch process for copper. The damascene and dual damascene approaches have developed to address this shortcoming. A brief description of the dual damascene process is provided hereafter as described, for example, in U.S. Pat. No. 6,444,568 to Sundarararjan et al., entitled "Method of Forming Copper Diffusion Barrier", the entirety of which is hereby incorporated herein by reference.

In the dual damascene process, an insulating layer is deposited over a copper layer. The insulating layer is then patterned to form a two-step connection having a narrower lower portion (referred to as a via portion) exposing selected connection areas on the underlying patterned metal layer and a wider upper portion (referred to as a trench portion) that serves to form the next layer of metal lines. The trench or the via portion can be formed first. Copper is then deposited to fill the two-step connection. A top portion of the copper layer is then removed using a chemical mechanical polishing (CMP) process. The resultant structure includes a via (the copper filled via portion) that connects the underlying metal layer with an overlying copper line (the copper filled trench portion). The contacts from the first copper metal layer to the devices are usually made with Tungsten (W) plugs.

When copper is used for these interconnects, the copper atoms must be prevented from migrating or diffusing into adjacent interlayer dielectric layers to prevent compromise of the integrity of the dielectric layers, particularly at low temperatures and under accelerated electric fields. Therefore, a dielectric diffusion barrier (DDB) is typically formed between the top of the copper metal line or layer and a subsequently deposited ILD to prevent this migration. Likewise, the copper metal line may be encapsulated with a diffusion barrier to prevent migration into a surrounding inter-metal dielectric (IMD) layer.

Currently, refractory metals such as Tantalum and Titanium and their nitrided compounds, i.e., TaN and TiN, are employed as the metal barrier against copper penetration into $SiO_2$ and low-k interlayer dielectric layers. As device sizes decrease to 0.1 μm and below, however, the main advantage of using low-resistance copper interconnects begins to be negated by the higher resistance metal barrier layers, resulting in an increase in RC time delay. Still further, as these refractory metal barrier layers become increasingly thinner, reliability concerns such as line-line leakage, time-dependent dielectric breakdown (TDDB) lifetime and BTS (Bias-Temperature Stress) leakage arise due to poor barrier integrity.

Therefore, there remains a need for an improved low resistance copper interconnect structure and method of manufacturing the same in integrated circuit devices.

SUMMARY OF THE INVENTION

A method of forming copper interconnects for an integrated circuit is provided. An antireflective coating layer is formed over an insulating layer formed over a semiconductor substrate. An interconnect pattern is patterned and etched into said insulating layer. A diffusion barrier layer is then conformally deposited in a deposition chamber along the etched interconnect pattern, wherein the antireflective coating is removed in said chamber before deposition of the barrier layer. Copper interconnects are then formed in the interconnect pattern etched in the insulating layer.

In another embodiment of a method of forming copper interconnects for an integrated circuit, an interconnect pattern is patterned and etched in a low-k dielectric insulating layer. A dielectric diffusion barrier layer is conformally deposited over the etched insulating layer and along the etched interconnect pattern. A layer of copper is deposited over the diffusion barrier layer formed over the insulating layer and in the etched interconnect pattern. The deposited copper layer is then polished down to the diffusion barrier layer formed over the insulating layer.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

A damascene based method of forming a copper interconnect structure is described below in connection with FIGS. 1–6. It should be understood that the method described herein is equally applicable to both damascene and dual damascene fabrication techniques.

Figure 1:
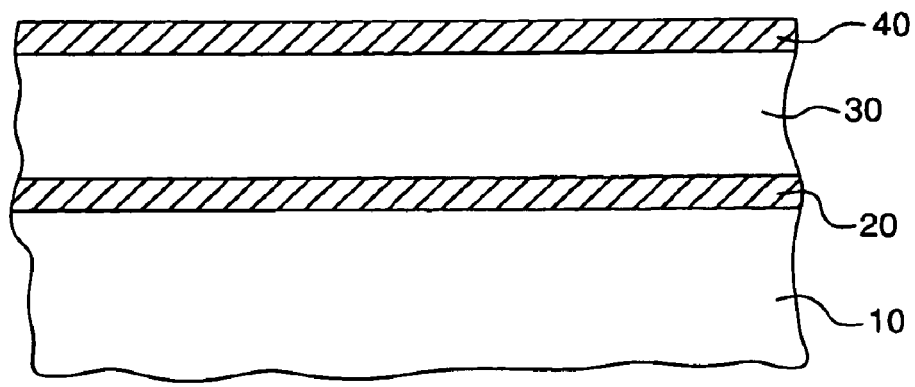
FIG. 1 is a cross-sectional view of a portion of a semiconductor device structure having a low-k inter-metal dielectric layer formed over an inter-level dielectric layer.

Referring first to FIG. 1, a cross-sectional view of a portion of the interconnect structure of a semiconductor device is provided. An etch stop layer 20 utilized in forming an interconnect pattern during the damascene process is formed over an insulating layer 10. In one embodiment, layer 10 includes an undoped silicate glass (USG), phosphosilicate glass (PSG) or boro-phosphosilicate glass (BPSG) material having a thickness greater than about 1.0 µm. Etch stop layer 20 typically includes SiN, SiC, SiCO, or SiCN deposited to a thickness between about 200–500 Å, and preferably about 400 Å. An inter-metal dielectric (IMD) layer 30 is deposited over the etch stop layer 20. IMD layer 30 may include $SiO_2$ or a low-k dielectric layer, such as an organo-silicate glass (OSG), porous SiLK (polyarylene ether) material available from Dow Chemical, LKD material available from JSR Microelectronics, an aerogel or a xerogel. A bottom anti-reflection coating (BARC) layer 40 is formed over IMD layer 30. Conventionally, BARC layer 40 includes a layer of an inorganic material such as SiON. In one exemplary embodiment, however, BARC layer 40 includes an organic material for use in a selected short wavelength lithography process, e.g., KrF lithography process or a deep ultraviolet (DUV) lithography process. Examples of exemplary materials include KRF-3G available from Clariant Corp. of Somerville, N.J. and DRV-42 and DUV-44 available from Drewscience.

Figure 2:
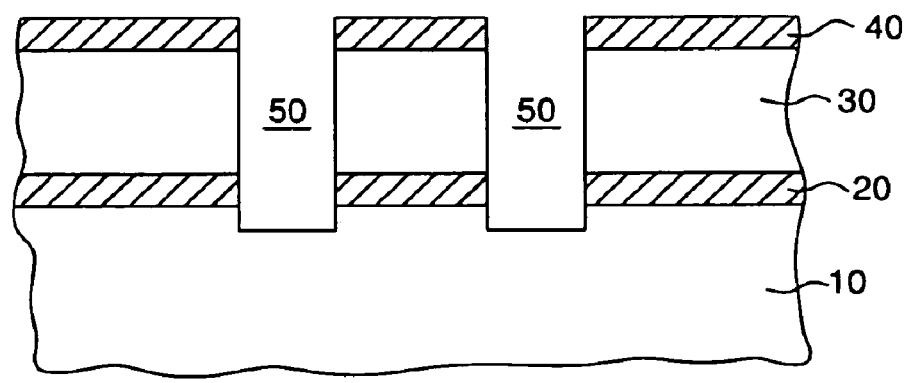
FIG. 2 shows the semiconductor structure of FIG. 1 having a pair of trenches formed therein.
Figure 3:
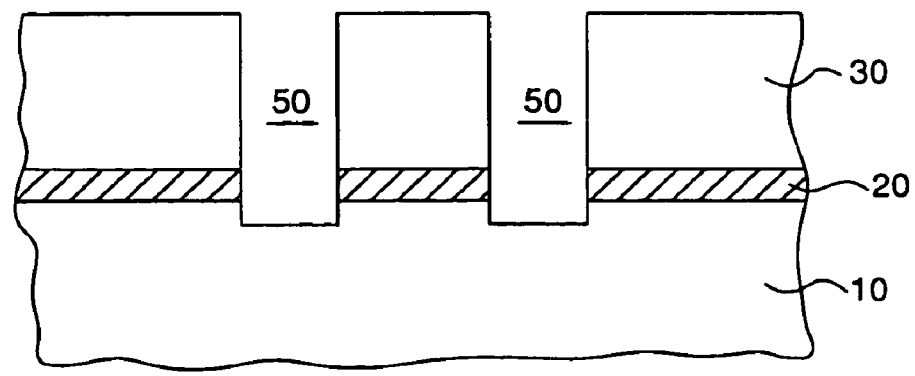
FIG. 3 shows the semiconductor structure of FIG. 2 having a BARC layer removed therefrom.

Referring now to FIG. 2, trenches 50 are shown etched into IMD layer 30 to form an interconnect pattern in IMD layer 30 for formation of copper interconnect lines. Although not shown, a photoresist is deposited over BARC layer 40 and patterned to define the desired interconnect pattern. The trenches 50 are then etched, and the photoresist is removed. As shown in FIG. 3, the BARC layer 40 is removed after the interconnect pattern is etched in the insulating layer 30. As mentioned above, in one embodiment BARC layer 40 is formed from an organic material that is then removed by baking the wafer in a deposition chamber utilized to deposit a diffusion barrier described in connection with FIG. 4. Organic materials such as those described above have low tolerances to process temperatures within the deposition chambers, such as those encountered when moisture is removed from the substrate prior to deposition to prevent defects. Using an organic BARC layer 40, therefore, allows for the cost effective and efficient in-situ removal of the BARC layer 40 as part of the deposition process.

Figure 4:
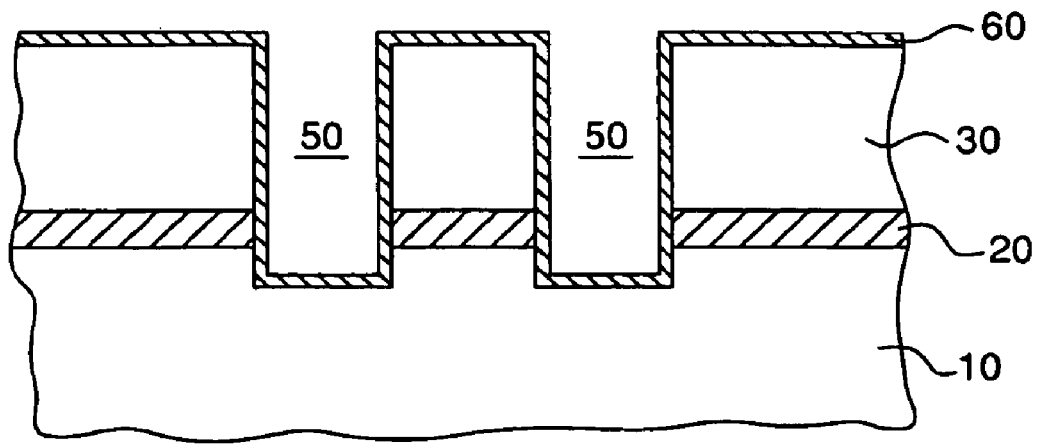
FIG. 4 shows the semiconductor structure of FIG. 3 having a non-metal diffusion barrier layer conformally deposited thereover.

After the BARC layer 40 is removed from the top surface of the IMD layer 30, a thin diffusion barrier layer 60 is conformally deposited over the structure, including along the surface of trenches 50 and over the exposed top surface of IMD layer 30 (FIG. 4). This diffusion barrier layer 60 is preferably deposited to a thickness of between 100–300 Å, and in one embodiment, is deposited via a plasma enhanced chemical vapor deposition (PECVD), thermal CVD or atomic layer deposition (ALD). The diffusion barrier layer 60 is preferably formed from a silicon carbide dielectric material, such as SiCO, SiCN or SiC. Silicon nitride (SiN) may also be utilized as a diffusion barrier, but this may not be preferred for future BEOL applications because of its high dielectric constant. An exemplary PECVD process for forming a SiC layer has the following parameters: feed gasses: trimethylsilane at 300 sccm; pressure: 3 Torr; HF power: 200W; LF power: 0W; and temperature: 350° C. An exemplary PECVD process for forming a SiCN layer has the following parameters: feed gasses: trimethylsilane at 300 sccm, helium at 400 sccm, and $NH_3$ at 325 sccm; pressure: 3 Torr; HF Power: 300 W; LF Power: 0W; and temperature: 350° C. An exemplary PECVD process for forming a SiCO layer has the following parameter: feed gasses: trimethylsilane at 160 sccm, helium at 400 sccm and $CO_2$ at 700 sccm; pressure: 2.5 Torr; HF power: 200W; LF Power: 0W; and temperature: 350° C. As mentioned above, an organic BARC layer 40 may be removed by baking the layer 40 in the PECVD, thermal CVD or ALD chamber, such as at a temperature between about 350–400° C. for about 30–60 seconds.

After the diffusion barrier 60 is formed as shown in FIG. 4, a thin adhesion layer (not shown) including a refractory metal (not shown), such as tantalum (Ta), having a thickness of about 50 Å may be deposited over the barrier layer 60 and in the trench region 50. This adhesion layer is provided to improve the adhesion of the copper seed layer to the trenches 50, although silicon carbides do exhibit strong adhesion to both copper and low-k dielectric materials such as organo-silicate glass. Copper interconnects 70 (FIG. 5) are then formed in trenches 50 per conventional damascene techniques. A copper seed layer is deposited over the barrier layer 60 and in the trenches 50, and a layer of copper is then deposited using electrochemical plating (ECP) in the trench and over the diffusion barrier 60. This deposited copper layer is then polished via chemical mechanical polishing (CMP) down to the diffusion barrier layer 60 to form copper interconnect lines 70.

Because the diffusion barrier 60 covers the top surface of the IMD layer 30, no polishing is performed directly on the low-K IMD layer 30. This process may be incorporated into existing tools and processes. Conventional polishing slurries for polishing copper in the damascene process, such as SS-12 slurry available from Cabot Microelectronics Corporation, have very low etch rates for materials such as SiC, SiCO, SiCN and SiN, thereby providing an effective CMP end point.

A second etch stop layer 80 is then formed over the exposed diffusion layer 60 and copper interconnect lines 70 for use in forming the next metallization level. In one embodiment, second etch stop layer 80 is a SiN, SiC, SiCO or SiCN layer having a thickness between about 400–600 Å, and preferably around 500 Å. Sandwiching a dielectric layer 60 between the etch stop layer 80 and the low-k IMD layer 30 reduces the surface electric field between the etch stop layer 80 and the low-k IMD layer 30, which reduces leakage. Still further, adhesion between the etch stop layer 80 and the low-k IMD layer 30 is promoted. While interconnect RC time delay rises with increasing thickness of either metal or dielectric barrier, the rate of RC time delay increases more rapidly for metal diffusion barriers. Therefore, use of a silicon carbide dielectric material for the diffusion barrier layer 60 helps alleviate the aforementioned RC time delay problems associated with metal diffusion barrier layers, while exhibiting better diffusion characteristics under TDDB and BTS testing because of improved barrier integrity and cost reduction.

Figure 5:
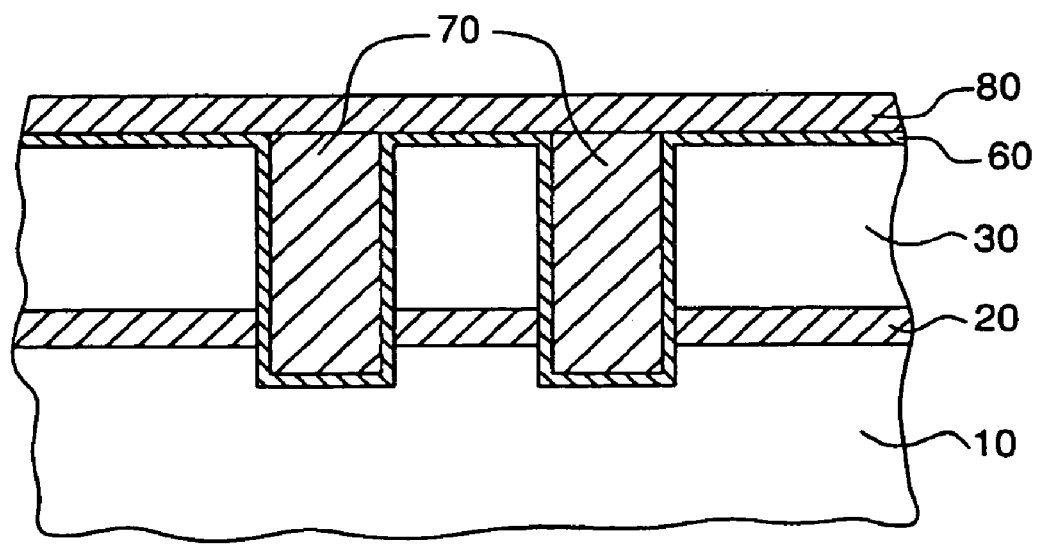
FIG. 5 shows the semiconductor structure of FIG. 4 having copper lines formed in the etched trenches and an etch stop layer formed thereover.
Figure 6:
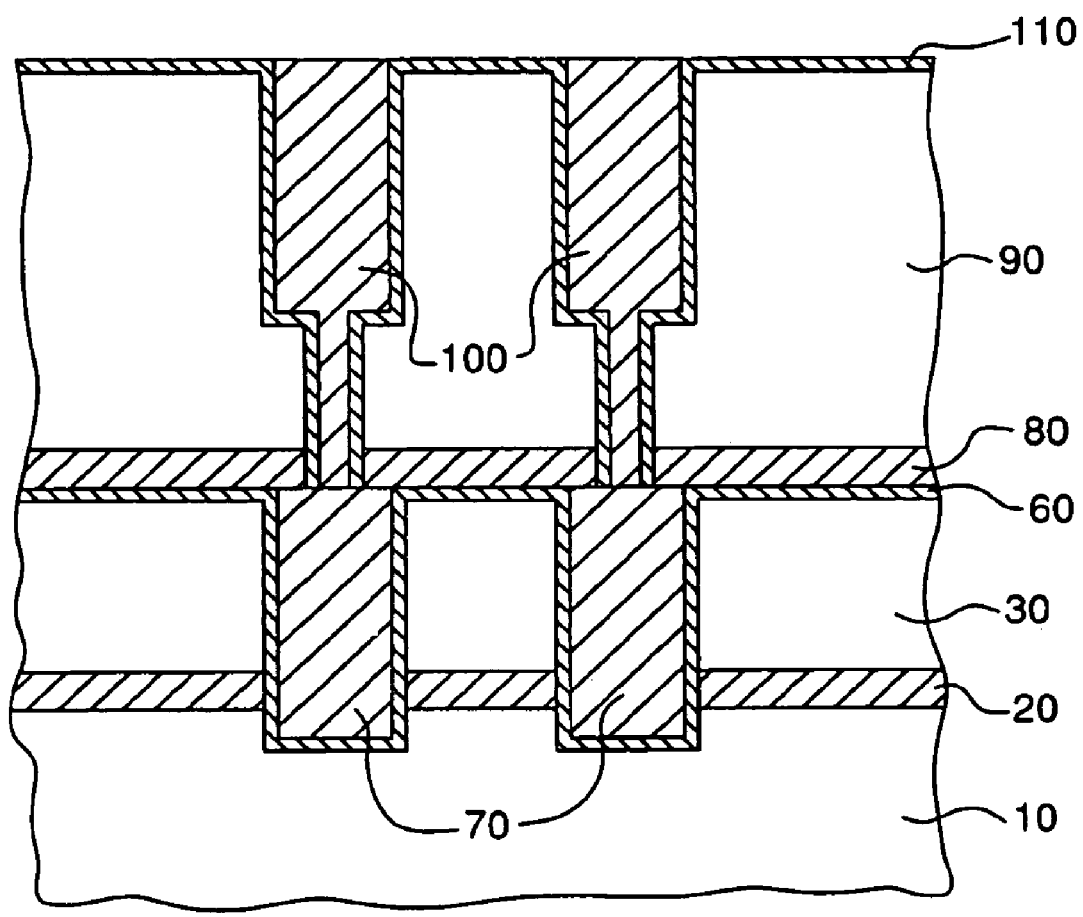
FIG. 6 shows the semiconductor structure of FIG. 5 having a second metallization layer formed thereover.

Referring now to FIG. 6, a second metallization layer, shown as a dual damascene copper interconnect structure, is formed over etch stop layer 80. A second low-k dielectric insulating layer 90 is deposited over the etch stop layer 80. In one exemplary embodiment insulating layer 90 includes a layer of organo-silicate glass (OSG), porous SiLK material, LKD material, an aerogel or a xerogel having a thickness of greater than about 6000 Å. Via and trench patterns are etched in the insulating layer 90, stopping at etch stop layer 80. An organic BARC layer may be utilized during the photolithography process and then removed as described above in the diffusion barrier deposition chamber. Once the via and trench structures are etched into the insulating layer 90, a dielectric diffusion barrier layer 110, preferably including a silicon carbide material, is conformally deposited via a PECVD, thermal CVD or ALD process to line the trench and via openings and preferably to cover the exposed top portion of the insulating layer 90. The portion of the diffusion barrier over the via floor above each of the copper lines 70 is then removed along with the corresponding portion of etch stop layer 80 via dry etch process during liner removal to expose the copper lines 70. A thin tantalum adhesion layer (not shown) may optionally be deposited as described above over the diffusion barrier layer 110 in the opened trench and via regions. A copper seed is then deposited, and a layer of copper is deposited in an ECP process to fill the etched trench and via regions. This copper layer is then polished via CMP down to the diffusion barrier layer 110 formed over the insulating layer, thereby forming copper interconnects 100 in the insulating layer 90 as shown in FIG. 5.

Referring to FIG. 6, the vias of copper interconnects 100 directly contact the copper lines 70. This feature provides lower resistance vias when compared to interconnect structures that have a diffusion barrier including a refractory metal such as TaN separating the two copper interconnects.

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. A method of forming copper interconnects for an integrated circuit, comprising the steps of:
    forming an antireflective coating layer over an insulating layer formed over a semiconductor substrate;
    patterning and etching an interconnect pattern in said insulating layer;
    conformally depositing in a deposition chamber a diffusion barrier layer along said etched interconnect pattern, wherein said antireflective coating is removed in said chamber before deposition of said diffusion barrier layer; and
    forming copper interconnects in said interconnect pattern etched in said insulating layer.

2. The method of claim 1, wherein said antireflective coating layer includes an organic material.

3. The method of claim 2, further comprising the step of baking said antireflective coating layer in said chamber, whereby said antireflective coating layer is removed.

4. The method of claim 3, wherein said organic material is selected for use in a KrF or DUV lithography process.

5. The method of claim 3, wherein said baking step is at a temperature between about 350–400° C. for about 30–60 seconds.

6. The method of claim 1, wherein said diffusion baffler layer is deposited using plasma enhanced chemical vapor deposition, thermal chemical vapor deposition or atomic layer deposition.

7. The method of claim 1, wherein said insulating layer includes a low-k dielectric material.

8. The method of claim 7, wherein said diffusion barrier layer includes a dielectric material.

9. The method of claim 8, wherein said diffusion barrier layer includes a dielectric material selected from the group consisting of SiC, SiCN, SiCO and SiN.

10. A method of forming copper interconnects for an integrated circuit, comprising the steps of:
    patterning and etching an interconnect pattern in a low-k dielectric insulating layer;
    conformally depositing a dielectric diffusion baffler layer over said etched insulating layer and along said etched interconnect pattern;
    depositing a layer of copper over said dielectric diffusion barrier layer formed over said low-k dielectric insulating layer and in said etched interconnect pattern; and
    polishing said deposited copper layer down to said dielectric diffusion barrier layer formed over said low-k dielectric insulating layer.

11. The method of claim 10, wherein said dielectric diffusion barrier layer includes a dielectric material selected from the group consisting of SiC, SiCN, SiCO and SiN.

12. The method of claim 10, wherein said dielectric diffusion barrier layer includes a silicon carbide dielectric material.

13. The method of claim 12, wherein said dielectric diffusion barrier layer is deposited using plasma enhanced chemical vapor deposition, thermal chemical vapor deposition or atomic layer deposition.

14. The method of claim 12, wherein said dielectric diffusion barrier layer is deposited to a thickness between about 100–300 Å.

15. The method of claim 10, further comprising the steps of forming a second metallization layer of copper interconnects over said polished copper layer.

16. The method of claim 15, wherein said step of forming a second metallization layer includes the following steps:
    depositing an etch stop layer over said polished copper layer;
    depositing a second insulating layer over said etch stop layer; and
    forming a layer of copper interconnects in said second insulating layer.

17. The method of claim 16, wherein said second insulating layer includes a low-k dielectric material.

18. The method of claim 10, further comprising the step of depositing a metal adhesion layer over said dielectric diffusion barrier layer before depositing said copper layer.

19. The method of claim 18, wherein said metal adhesion layer includes a refractory metal.

20. A method of forming copper interconnects for an integrated circuit, comprising the steps of:
    (a) forming an antireflective coating layer over an insulating layer formed over a semiconductor substrate;
    (b) after step (a), patterning and etching an interconnect pattern in said insulating layer;
    (c) conformally depositing in a deposition chamber a diffusion barrier layer along said etched interconnect pattern, wherein said antireflective coating is removed in said chamber before deposition of said diffusion barrier layer; and
    (d) after step (c), forming copper interconnects in said interconnect pattern etched in said insulating layer.

21. The method of claim 20, wherein said diffusion barrier layer includes a dielectric material.

22. The method of claim 20, wherein said antireflective coating layer includes an organic material, the method further comprising the step of baking said antireflective coating layer in said chamber to remove said antireflective coating layer.

23. The method of claim 22, wherein said baking step is at a temperature between about 350–400° C. for about 30–60 seconds.

* * * * *

UNITED STATES PATENT AND TRADEMARK OFFICE
CERTIFICATE OF CORRECTION

| | | |
|---|---|---|
| PATENT NO. | : 7,056,826 B2 | Page 1 of 1 |
| APPLICATION NO. | : 10/337684 | |
| DATED | : June 6, 2006 | |
| INVENTOR(S) | : Zhen-Cheng Wu et al. | |

It is certified that error appears in the above-identified patent and that said Letters Patent is hereby corrected as shown below:

Column 5, line 49, delete "baffler" and insert therefor --barrier--; and

Column 5, line 64, delete "baffler" and insert therefor --barrier--.

Signed and Sealed this

Ninth Day of January, 2007

JON W. DUDAS
*Director of the United States Patent and Trademark Office*